US006538468B1

(12) United States Patent
Moore (10) Patent No.: US 6,538,468 B1
(45) Date of Patent: Mar. 25, 2003

(54) METHOD AND APPARATUS FOR MULTIPLE BOOT-UP FUNCTIONALITIES FOR A PROGRAMMABLE LOGIC DEVICE (PLD)

(75) Inventor: Michael T. Moore, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/629,916

(22) Filed: Jul. 31, 2000

(51) Int. Cl.[7] ................................................. H03K 7/38
(52) U.S. Cl. ............................. 326/40; 326/39; 326/37; 365/228; 716/17
(58) Field of Search .............................. 326/39, 38, 40, 326/41; 365/228

(56) References Cited

U.S. PATENT DOCUMENTS

| 5,635,855 | A |   | 6/1997 | Tang |
| 5,751,163 | A |   | 5/1998 | Tang et al. |
| 5,769,288 | A |   | 6/1998 | Jones |
| 5,789,938 | A | * | 8/1998 | Erickson et al. ............... 326/40 |
| 5,796,780 | A |   | 8/1998 | Lottridge et al. |
| 5,859,544 | A | * | 1/1999 | Norman ........................ 326/40 |
| 6,023,570 | A |   | 2/2000 | Tang et la. |
| 6,102,963 | A | * | 8/2000 | Agrawal ....................... 716/17 |
| 6,134,703 | A |   | 10/2000 | Allen |
| 6,185,126 | B1 |   | 2/2001 | Rodgers et al. |
| 6,198,303 | B1 | * | 3/2001 | Rangasayee .................. 326/38 |
| 6,215,689 | B1 |   | 4/2001 | Chhor et al. |
| 6,222,757 | B1 | * | 4/2001 | Rau et al. ..................... 365/154 |

OTHER PUBLICATIONS

Agrawal, Dr. Om, "Non–Volatility and Infinited Reconfigurability in PLDs", *Lattice Semiconductor "WHITE PAPER"* available at www.latticesemi.com.
U.S. Patent Application Serial No. 09/751,234, filed Dec. 27, 2000 *PLD Configuration Architecture* (not published).

* cited by examiner

Primary Examiner—Michael Tokar
Assistant Examiner—Vibol Tan
(74) Attorney, Agent, or Firm—Bradley T. Sako (57) ABSTRACT According to one embodiment, a programmable logic assembly (200) may include a nonvolatile memory devices (202-0 and 202-1) coupled to an associated volatile programmable logic device (PLD) (204). Each nonvolatile memory device (202-0 and 202-1) may store different configuration data for a volatile PLD (204). Upon a predetermined event, such as powerup or reset, one of the nonvolatile memory devices (202-0 and 202-1) may be selected and its configuration data read into a volatile PLD (204).

21 Claims, 5 Drawing Sheets

METHOD AND APPARATUS FOR MULTIPLE BOOT-UP FUNCTIONALITIES FOR A PROGRAMMABLE LOGIC DEVICE (PLD)

TECHNICAL FIELD

The present invention relates generally to programmable logic devices (PLDs), and more particularly to PLDs that may receive configuration information from a storage device.

BACKGROUND OF THE INVENTION

Programmable logic has increasingly become a valued resource for system designers. Programmable logic can allow for a custom logic design to be implemented without the initial cost, delay and complexity of designing and fabricating an application specific integrated circuit (ASIC).

Currently, there are many variations of programmable logic, including simple programmable logic devices (SPLDs), complex PLDs (CPLDs), and field programmable gate arrays (FPGAs). Such devices typically include programmable logic circuits that operate in conjunction with corresponding memory circuits. The particular function of a logic circuit can be determined according to data stored in a corresponding memory circuit. Some programmable logic arrangements can include switching circuits (also called programmable interconnects) that can enable and/or disable switching paths according to data stored in a memory circuit. A memory circuit is typically a nonvolatile memory circuit, such as a programmable read-only-memory (PROM), an electrically programmable ROM (EPROM), and/or electrically erasable and programmable ROM (EEPROM), including "flash" EEPROMs.

A nonvolatile memory circuit can be formed on a different integrated circuit than programmable logic. That is, a programmable logic circuit die can receive configuration information from an associated nonvolatile memory circuit that may be on the same die or a separate die.

In addition to the above basic structure, programmable logic arrangements may have alternate structures. For example, while a system may include a separate programmable logic device and an EEPROM memory circuit, some processes may be capable of forming nonvolatile devices and conventional volatile devices on the same integrated circuit. In such a case, the nonvolatile memory circuit is "on-chip" (or integrated) with a volatile programmable logic circuit.

To configure programmable logic, a memory circuit within the device can be programmed with data values that give the desired functionality. In many cases, a volatile PLD and nonvolatile memory device may be included in the same assembly. When power is applied to the assembly (e.g., upon bootup), a volatile PLD can automatically load configuration data stored in a corresponding nonvolatile memory.

PLDs are typically included within a larger electronic device to provide a particular function. That is, in a normal operating mode, a PLD may perform particular logic function determined according to user configuration data. However, an electronic system may have other modes where additional functions are desired. For example, an electronic device may have a programming mode in which the device can be configured in a variety of ways. In order to execute programming operations, the device may include or have to be connected to, a computing device. Such a computing device may include, but is not limited to, a microcontroller, microprocessor or digital signal processor (DSP) device. A computing device can execute various steps required in a programming operation. Unfortunately, the addition of a computing device can add to the size, cost, or complexity of an electronic device.

To better understand the operation of the various embodiments of the present invention, the operation of a conventional programmable logic assembly will now be described.

Figure 9A:
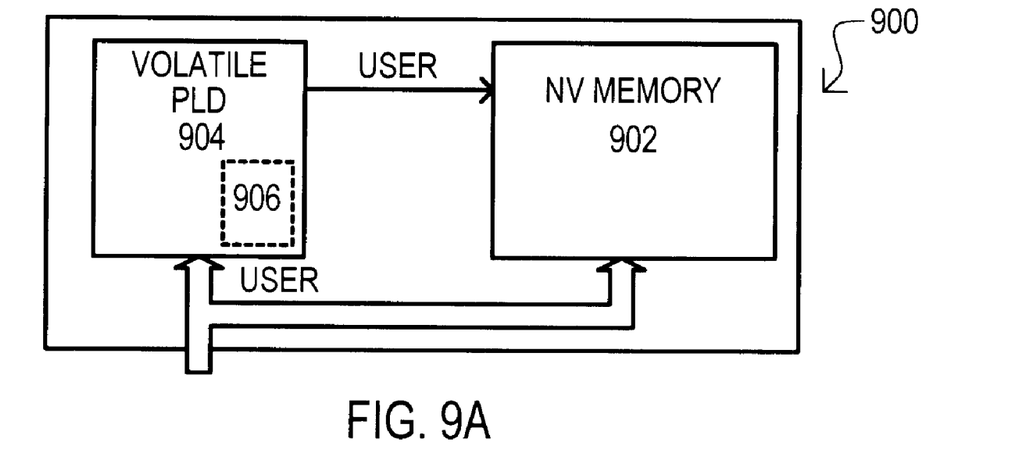
FIGS. 9A and 9B are block diagrams illustrating the operation of a conventional programmable logic assembly.
Figure 9B:
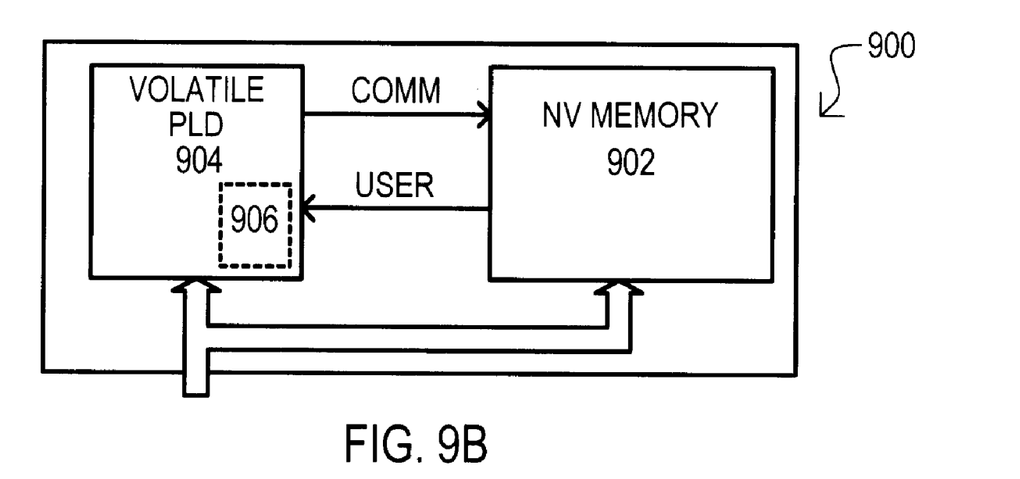

Referring now to FIGS. 9A and 9B, a programmable logic assembly 900 is shown that includes a nonvolatile memory 902 and a volatile programmable logic device (PLD) 904. A volatile PLD can include a bootup state machine 906. A bootup state machine 906 may execute a series of functions when power is initially supplied to an assembly 900.

FIG. 9A shows a conventional programming operation. Configuration data may be entered that can establish a user-defined functionality for a volatile PLD 904. In particular, configuration data may be entered by way of a volatile PLD 904 programmed into a nonvolatile memory 902.

FIG. 9B shows a bootup operation. In a bootup operation, a state machine 906 may detect that power is being initially supplied to an assembly 900. A state machine 906 may then apply a series of read commands to a nonvolatile memory 902. In response to such read commands a nonvolatile memory 902 can provide user configuration data to a volatile PLD 904. User data can be received by a volatile PLD 904 to establish a function for a volatile PLD 904. As but one example, in response to a series of read commands, user configuration data from a nonvolatile memory 902 can be stored in corresponding locations of a volatile memory within a volatile PLD 904. In this way, a volatile PLD 904 may be programmed to perform a user-determined function.

While a programmable logic assembly 900 may be user configured to perform a particular function, as noted above, a system may have a need for other functions. In addition, in some cases there may be a particular configuration for a programmable logic assembly 900 that is commonly desired, such as a microcontroller or some other computing device.

In light of the above discussion, it would desirable to arrive at some way of providing additional functionality to a programmable logic assembly.

SUMMARY OF THE INVENTION

The present invention includes a programmable logic assembly that may include a volatile programmable logic device (PLD) that may be selectively configured in response to a particular event, such as powerup and/or reset.

According to one aspect of the embodiments, a programmable logic assembly may include two or more nonvolatile memory devices that may each store configuration data. In response to a select signal, a multiplexer can provide configuration data from one of the nonvolatile memory devices.

According to another aspect of the embodiments, a programmable logic assembly may include a nonvolatile memory device with two or more different address spaces. In response to a select state, configuration data may be read from one address space to a volatile PLD.

According to another aspect of the embodiments, a programmable logic assembly may include a first nonvolatile memory formed on a different die than a volatile PLD and a second nonvolatile memory formed on the same die as a volatile PLD. A first and second nonvolatile memory may store different configuration data sets.

DETAILED DESCRIPTION OF THE EMBODIMENTS

Various embodiments will now be described in conjunction with a number of diagrams. The embodiments set forth a programmable logic assembly that may include a volatile programmable logic device (PLD) that can provide a particular function according to configuration data. An assembly may also include one or more nonvolatile memories that store two or more sets of configuration data. According to a predetermined event (e.g., powerup and/or reset) one set of configuration data (from multiple possible sets) may be loaded into a volatile PLD.

Figure 1:
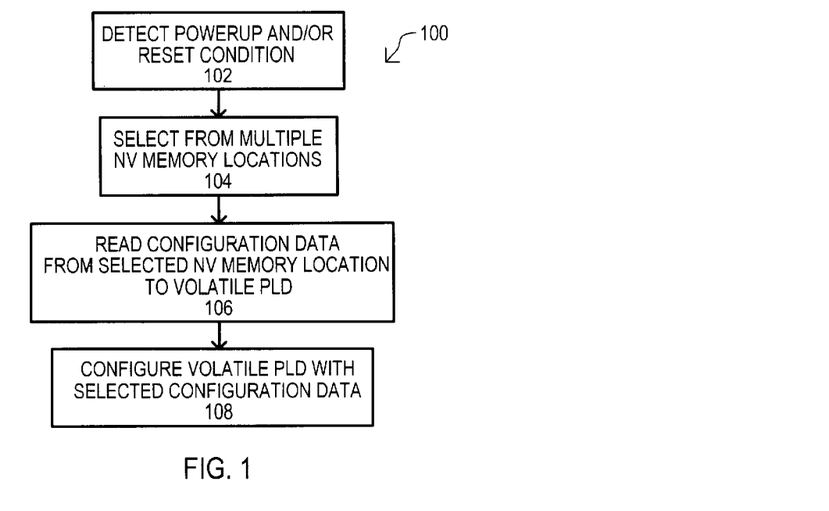
FIG. 1 is a flow diagram showing the operation of a programmable logic assembly according to one embodiment.

Referring now to FIG. 1, the general operation of an embodiment is set forth in a flow diagram 100. A step 102 may include detecting a particular event, e.g., powerup and/or reset. Detecting a powerup condition may include determining when power is applied to a programmable logic assembly, as but one example. In addition or alternatively, a detecting a reset condition may include sensing when a particular reset signal or reset command is applied to a programmable logic assembly, as but one example.

In addition to detecting a powerup and/or reset condition, an operation 100 may also include selecting from multiple nonvolatile memory locations (step 104). A step 104 may include enabling a data transfer path between one nonvolatile memory location that has been selected from a group of at least two nonvolatile memory locations. Such an arrangement may allow for a programmable logic assembly to include multiple possible configurations that are selectable in response to an event such as powerup and/or reset.

As shown in FIG. 1, once a particular nonvolatile memory location has been selected, configuration data may be read from a selected nonvolatile memory to a volatile PLD (step 106). Selected configuration data may configure a volatile PLD for a particular function (step 108). Because configuration data may be read from multiple locations, multiple configurations are possible. Such an arrangement may provide greater flexibility as a system may include a component having two or more distinct functions. Still further, a programmable logic assembly may be preprogrammed by a manufacturer to provide a commonly desired or high-demand function, saving time for a user, as the function does not have to be derived "from scratch." A microcontroller is but one example of a possible high-demand function.

Still further, by providing two or more possible configurations in a programmable logic assembly, a system may have more operational flexibility. For example, in one mode, a volatile PLD may be configured in one way. A programmable logic assembly may then be reset/rebooted and configured in one or more other ways.

Figure 2A:
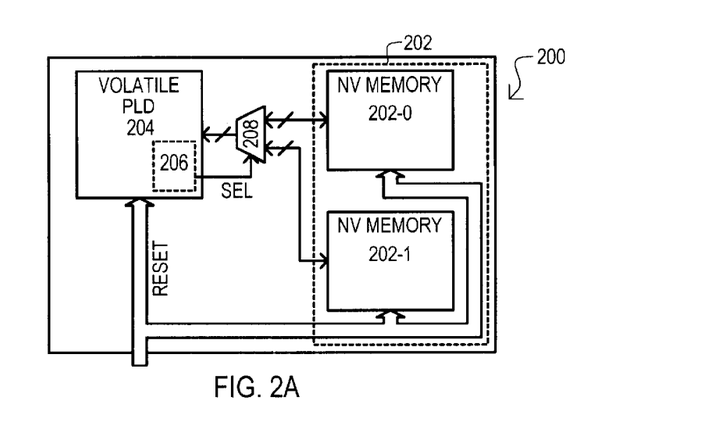
FIGS. 2A and 2B are block diagrams of a first and second embodiment.
Figure 2B:
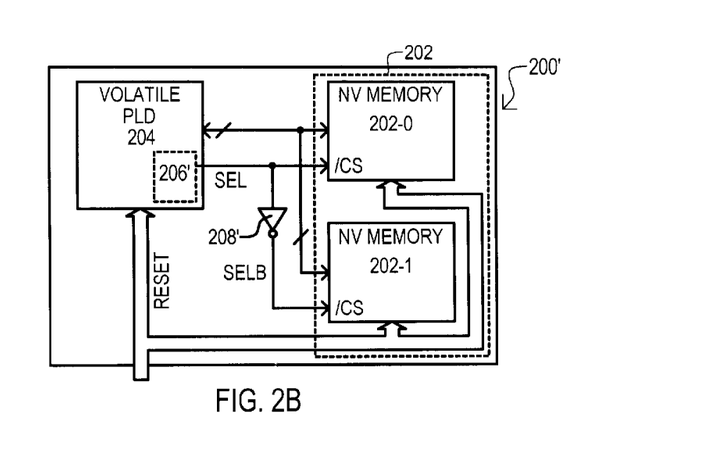

Referring now to FIGS. 2A and 2B, a first and second embodiment will now be described. FIG. 2A shows a programmable logic assembly according to a first embodiment. A first embodiment is designated by the general reference character 200 and is shown to include a nonvolatile memory section 202 and a volatile PLD 204. A nonvolatile memory section 202 may include a first nonvolatile memory device 202-0 and a second nonvolatile memory device 202-1. First configuration data may be stored in a first nonvolatile memory device 202-0 while second configuration data may be stored in a second nonvolatile memory device 202-1. In one particular arrangement, first configuration data may be user configuration data while second configuration data may be programmed by a manufacturer of a programmable logic assembly 200.

A volatile PLD 204 may include a state machine 206. A state machine 206 may include circuitry for selecting a particular nonvolatile memory location. In addition, a state machine 206 may include circuitry for executing a programming operation that may read configuration data from a nonvolatile memory location to a volatile PLD 204.

A programmable logic assembly 200 may also include selection circuitry 208. In a first embodiment 200, selection circuitry 208 may include a multiplexer that may provide a data path between a volatile PLD 204 and either a first nonvolatile memory device 202-0 or a second nonvolatile memory device 202-1. Selection circuitry 208 may be controlled according to a select signal SEL generated by a state machine 206.

FIG. 2B shows a programmable logic assembly according to a second embodiment. A second embodiment may include some of the same general constituents as a first embodiment. To that extent, like portions will be referred to by the same reference character. A first embodiment is designated by the general reference character 200' and may include a state machine 206' and selection circuitry 208' that may differ from a first embodiment. Second embodiment 200' selection circuitry 208' may include an inverter that generates an inverted select signal SELB from a select signal SEL.

It is understood that while selection circuitry (such as 208/208') is illustrated in an assembly 200/200', such selection circuitry may be included within a volatile PLD (such as 204) and/or within a nonvolatile memory device (202-0 and/or 202-1).

Further, it is also understood that while the examples of FIGS. 2A and 2B illustrates two nonvolatile memory devices (202-0 and/or 202-1), an assembly (200/200') may include more than two nonvolatile memory devices.

Figure 3A:
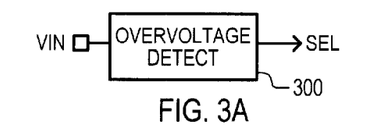
FIGS. 3A to 3C are block diagrams of arrangements for detecting a powerup and/or reset condition according to particular embodiments.
Figure 3B:
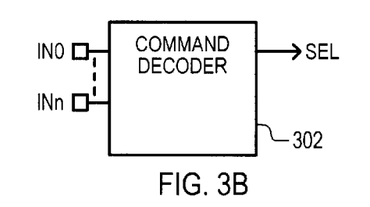
Figure 3C:
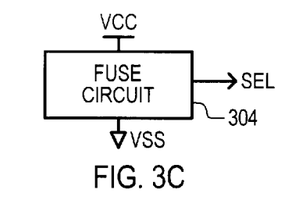

Having described a first and second embodiment (200 and 200'), various components that may include included in a first and/or second embodiment (200 and 200') will now be described. Referring now to FIGS. 3A to 3C, various approaches to generating a select signal are disclosed.

FIG. 3A shows an overvoltage detect approach. An overvoltage detect circuit 300 may receive a voltage VIN. In the event a voltage VIN exceeds a particular voltage, a select signal SEL may be low. In the event a voltage VIN is below a particular voltage, a select signal SEL may be high, or vice versa.

FIG. 3B shows a command entry approach. A command decoder 302 may receive one or more input signals (IN0 to INn). In the event input signals (IN0 to INn) have one particular combination of values, a select signal SEL may be low. In the event input signals (IN0 to INn) have another combination of values, a select signal SEL may be high.

FIG. 3C shows a programmable approach. A fuse circuit 304 may be connected between a high power supply voltage VCC and a low power supply voltage VSS. A fuse circuit 304 may include a nonvolatile circuit element, such as a fusible link and/or nonvolatile memory cell that may be set to one of at least two states. If a nonvolatile circuit element is set to one state, a select signal SEL may be low. If a programmable element is set to another state, a select signal SEL may be high.

Of course, the particular arrangements of FIGS. 3A to 3C represent but a few of the many possible ways of ways of detecting a powerup and/or reset condition, and should not be construed as limiting the invention to such particular arrangements.

Figure 4:
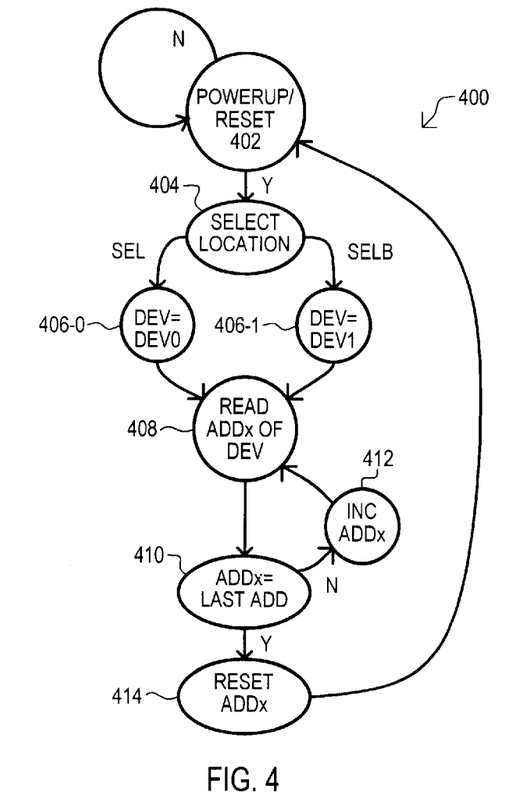
FIG. 4 is a diagram of a state machine operation that may be used in a first or second embodiment.

FIG. 4 is a diagram showing the operation of a state machine that may be used in a first or second embodiment. A diagram is designated by the general reference character 400 and is shown to include an initial determination of a powerup and/or reset state 402. If a powerup and/or reset condition exists, a nonvolatile memory location may be selected 404. Such an operation may include one or more of the various approaches shown in FIGS. 3A to 3C.

In FIG. 4, according to selection location step, one of two nonvolatile memory devices will be selected 406. In particular, a selected device DEV may be a first nonvolatile memory device (DEV0) (406-0) or a second nonvolatile device (DEV1) (406-1). Even more particularly, such an arrangement may include controlling a multiplexer according to a select signal SEL, as set forth in FIG. 2A, and/or selecting one nonvolatile memory device while de-selecting the other, as set forth in FIG. 2B.

With a particular nonvolatile memory device selected, data may be read from the selected nonvolatile memory device 408. In the particular example of FIG. 4, data may first be read from a selected device DEV at an address ADDx. An address ADDx may then be compared with a last address 410. In the event ADDx is not a last address, an address ADDx may be incremented 412 and data may be read from such an incremented address.

When an address ADDx is a last address, an address value may be reset to an initial address value 414 and a state machine may return to a state 402.

In this way, in response to a particular event (e.g., powerup or reset) a programmable logic assembly (such as 200 or 200') may load configuration data from one of a number of different nonvolatile memory devices.

In one particular arrangement, a nonvolatile memory device (202-0 or 202-1) may include an electrically erasable and programmable read-only-memory (EEPROM), such as a "flash" EEPROM. In addition, a nonvolatile memory device (202-0 or 202-1) may be formed on a different integrated circuit die than a volatile PLD 204. As but a two of the many possible arrangements, a volatile PLD 204 and nonvolatile memory devices (202-0 or 202-1) may be different dice assembled in the same package (e.g., multi-chip module, or the like). Alternatively, a volatile PLD 204 and nonvolatile memory (202-0 or 202-1) may be formed in different packages on the same circuit board.

While separate configuration data may be provided in two separate devices, separate configuration data may also be provided in a single device. An example of such an arrangement is shown as a third embodiment in FIG. 5.

Figure 5:
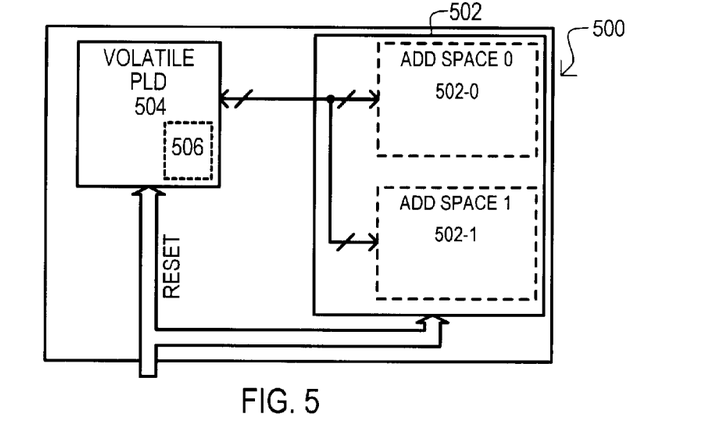
FIG. 5 is a block diagram of a third embodiment.

A third embodiment is designated by the general reference character 500 and is shown to include a nonvolatile memory section 502 and a volatile PLD 504. A nonvolatile memory section 502 may include a nonvolatile memory device having different address spaces 502-0 and 502-1. Different address spaces may include one range of addresses while another may represent another range of addresses. In one particular arrangement, first configuration data may be stored in a first address space 502-0 while second configuration data may be stored in a second address space 502-1. First configuration data may be user configuration data while second configuration data may be programmed by a manufacturer of a programmable logic assembly 500.

A volatile PLD 504 may further include a state machine 506. A state machine 506 may include circuitry for selecting a particular nonvolatile memory address space (502-0 or 502-1). In addition, a state machine 506 may also include circuitry for executing a programming operation that may read configuration data from a selected address space (502-0 or 502-1).

It is understood that while the example of FIG. 5 illustrate two addresses spaces (502-0 and/or 502-1), a memory section could include more than two such addresses spaces.

Figure 6:
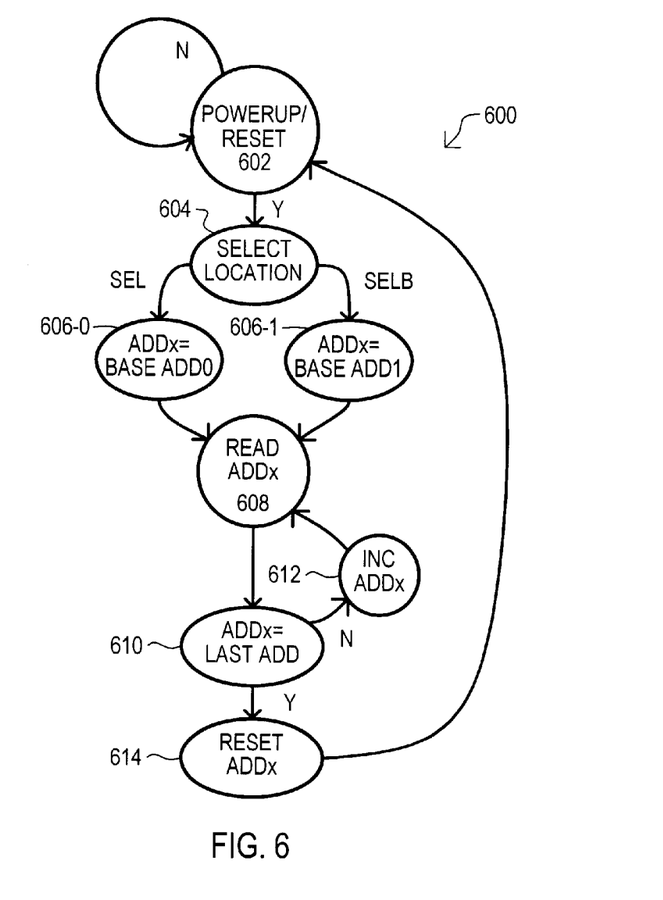
FIG. 6 is a diagram of a state machine operation that may be used in a third embodiment.

FIG. 6 is a diagram showing the operation of a state machine that may be used in a third embodiment. In FIG. 6, a diagram is designated by the general reference character 600 and is shown to include an initial determination of a powerup and/or reset state 602. If a powerup and/or reset condition exists, a nonvolatile memory location may be selected 604. Such an operation may include one or more of the various approaches shown in FIGS. 3A to 3C, as but a few examples.

In FIG. 6, according to selection location step 604, one of multiple nonvolatile memory address spaces may be selected. In particular, according to one select state SEL, an address ADDx may be set to a first base address ADD0. A first base address ADD0 may exist in a first address space 502-0, for example. According to another select state SELB, an address ADDx may be set to a second base address ADD1. A second base address ADD1 may exist in a second address space 502-1, for example.

With a particular address space selected, data may be read from the selected address space within nonvolatile memory device 608. In the particular example of FIG. 6, data may first be read from base address ADDx. An address ADDx may then be compared with a last address 610. In the event ADDx is not a last address, an address ADDx may be incremented 612 and data may be read from such an incremented address. Of course, a last address for one address space may be different from that of another address space.

When an address ADDx is a last address, an address value may be reset to an initial address value 614 and a state machine may return to a state 602.

In this way, in response to a particular event (e.g., powerup or reset) a programmable logic assembly 600 may load configuration data from one of a number of different memory locations within one nonvolatile memory device 502.

In one particular arrangement, a nonvolatile memory device 502 may include an electrically erasable and programmable read-only-memory (EEPROM), such as a "flash" EEPROM. Such a nonvolatile memory device 502 may be formed on a different integrated circuit die than a volatile PLD 504. As in the case of the first and second embodiments, as but a two of the many possible arrangements, a volatile PLD 504 and nonvolatile memory device 502 may be different dice assembled in the same package (e.g., multi-chip module, or the like). Alternatively, a volatile PLD 504 and nonvolatile memory device 502 may be formed in different packages on the same circuit board.

It is noted that while the diagram of FIG. 5 implies contiguous address spaces, alternate embodiments may include non-contiguous address spaces. In such a case, addresses would be incremented accordingly, to jump to those locations storing a desired configuration data set.

It is further noted that different address spaces (such as 502-0 and 502-1) are not necessarily exclusive. That is, different address spaces may overlap. As but one example, some memory locations within an address space 502-0 may be the same as some in address space 502-1. In this way, two different sets of configuration data that have like values may be stored in a more compact fashion.

Still further, in one particular arrangement, address spaces (502-0 and 502-1) within a nonvolatile memory 502 may be different sectors. In particular, such sectors may be separately erasable and one may be a "boot" sector. Boot sectors are well understood in the art any may include various protection features that prevent boot data from being erased and/or overwritten. Because one address space may be a boot sector, particular access procedures may have to be executed to access such an address space. That is, in some arrangements programming a boot sector address space may require more and/or different steps than programming a non-boot sector address space.

While separate configuration data may be provided one or more nonvolatile memory devices that are separate from a volatile PLD, configuration data may also be included on a volatile PLD die itself. An example of such an arrangement is shown as a fourth embodiment in FIG. 7.

Figure 7:
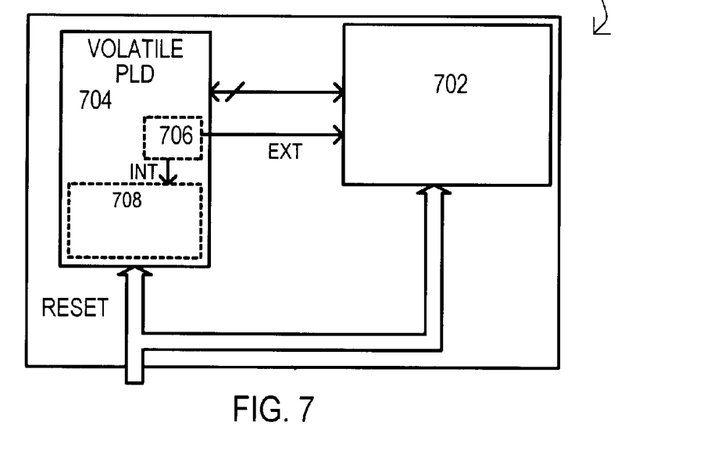
FIG. 7 is a block diagram of a fourth embodiment.

Referring now to FIG. 7, a fourth embodiment is designated by the general reference character 700 and may include a first nonvolatile memory 702 and a volatile PLD 704. Like the previously described embodiments, a volatile PLD 704 may include circuitry for a state machine 706 that may load configuration data from one of multiple nonvolatile memory locations. However, a volatile PLD 704 may differ from previously described embodiments in that configuration data may be included in a second nonvolatile memory 708 formed on a volatile PLD 704.

In one particular arrangement, first configuration data may be stored in a first nonvolatile memory 702-0 while second configuration data may be stored in a second nonvolatile memory 702-1. First configuration data may be user configuration data while second configuration data may be programmed by a manufacturer of a programmable logic assembly 700. In response to a particular event (e.g., powerup and/or reset), configuration data may be loaded from a first nonvolatile memory 702 or a second nonvolatile memory 708.

Figure 8:
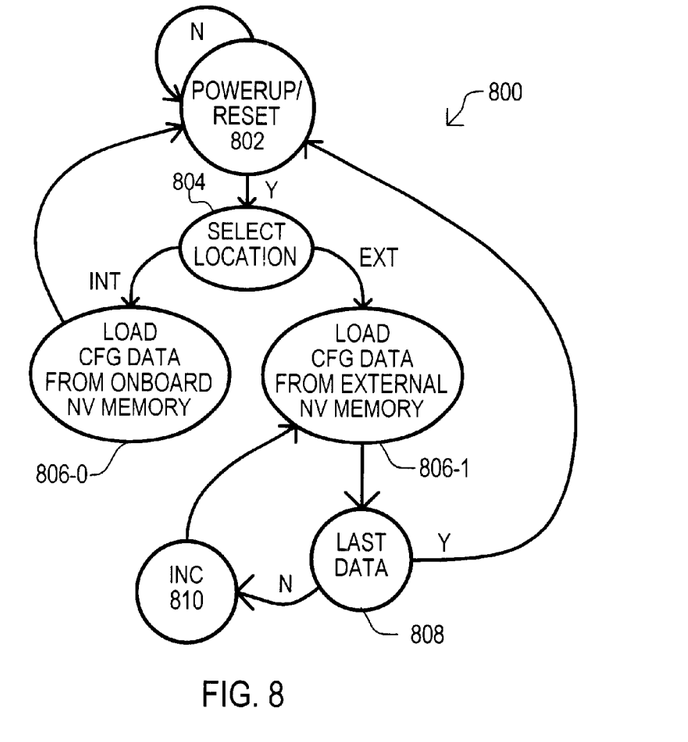
FIG. 8 is a diagram of a state machine operation that may be used in a fourth embodiment.

FIG. 8 is a diagram showing the operation of a state machine that may be used in a fourth embodiment. In FIG. 8, a diagram is designated by the general reference character 800. Like previously described state machine diagrams, a diagram 800 may include an initial determination of a powerup and/or reset state 802. If a powerup and/or reset state exists, an internal or external nonvolatile memory may be selected 804. Such an operation may include one or more of the various approaches shown in FIGS. 3A to 3C.

As shown in FIG. 8, if an internal nonvolatile memory device is selected, configuration data may be loaded from an onboard nonvolatile memory 806-0 (such as second nonvolatile memory 708). Once such a loading operation is complete, a state machine may return to a state 802. If an external nonvolatile memory device is selected, configuration data may be loaded from an external nonvolatile memory 806-1 (such as first nonvolatile memory 702). Such a loading operation may include determining if a last address location is reached 808 and incrementing an address value 810, as described in conjunction with previous embodiments. Once the last of the configuration data from an external nonvolatile memory ahs been loaded, a state machine may return to a state 802.

In one particular arrangement, a second nonvolatile memory 708 may be a mask programmable read only memory (PROM) formed on the same die as a volatile PLD 704. That is, a second nonvolatile memory 708 may be integrated with a volatile PLD 704. A mask PROM may be programmed in a manufacturing step when a volatile PLD 704 is initially formed. In many instances, a mask PROM may require less area than other nonvolatile memories, such as EEPROMs, including flash EEPROMs. Further, mask PROMs may be more easily implemented into an existing manufacturing process for volatile logic circuits, such those included in volatile PLD 704.

In addition or alternatively, a PLD 704 may be a device that includes both a volatile circuit elements and nonvolatile circuit elements. Such a device will be referred to herein as a mixed volatile/nonvolatile PLD 704. Within a mixed volatile/nonvolatile PLD 704, volatile circuit elements may form a programmable logic device while nonvolatile circuit elements may from a second nonvolatile memory that can store configuration data.

In one arrangement, a mixed volatile/nonvolatile PLD 704 may be fabricated with a process that is capable of forming both volatile logic circuits and re-programmable nonvolatile circuits. This is in contrast to the above-described example, which may include a mask PROM that is not re-programmable.

A mixed volatile/nonvolatile PLD 704 may take a variety of forms. As but one example, re-programmable nonvolatile circuits may include a nonvolatile memory cell array "embedded" within an associated volatile PLD. As another example, nonvolatile circuits may be distributed within volatile logic circuits. More particularly, some programmable logic approaches include unit cells with both volatile and nonvolatile circuit elements.

In this way, a fourth embodiment 700 may include a mixed volatile/nonvolatile PLD 702 that may provide one or more sets of configuration data without necessarily increasing the overall size of an assembly 700, as may be the case in previous described embodiments that may include two different nonvolatile memory devices or a nonvolatile memory device having multiple address spaces.

It is noted that while two particular events (powerup and reset) have been described for initiating the selection of configuration data from multiple nonvolatile memory locations, alternate embodiments may include other commands and/or conditions for loading configuration data.

In some arrangements, configuration data may be programmed by way of a test port. Configuration data may also be programmed into a separate nonvolatile memory device through a volatile PLD. Of course, in the case of a mask PROM, a manufacturing step may be used to program particular configuration data.

Further, a manufacturer may provide one particularly advantageous configuration data set. In particular, according to one embodiment, configuration data may be provided that can configure a volatile PLD to operate as a microcontroller.

It is understood that while particular nonvolatile structures have been described (i.e., EEPROMs and mask PROMs), other nonvolatile elements could be used in alternate embodiments, including but not limited to ferroelectric random access memories (FRAMs) and "anti-fuse" technology.

While the various figures have depicted multiple signal lines between nonvolatile memory devices and a volatile PLD, alternate embodiments could include a single line and serial communication between a nonvolatile memory device.

Further, while the various embodiments have illustrated examples that include two nonvolatile memory locations, it would be obvious to include more than two nonvolatile memory locations providing additional configuration possibilities for a volatile PLD.

Thus, it is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A programmable logic assembly, comprising:
    a programmable logic circuit that provides functions according to configuration data and generates addresses for a plurality of nonvolatile memory locations in response to a predetermined event; and
    first selectable nonvolatile memory locations that may store first configuration data for the programmable logic circuit and second selectable nonvolatile memory locations that may store second configuration data for the programmable logic circuit.

2. The programmable logic assembly of claim 1, wherein:
    the programmable logic circuit is formed on a first die and the first selectable nonvolatile memory locations are formed on a second die.

3. The programmable logic assembly of claim 2, wherein: the second die comprises a nonvolatile memory device.

4. The programmable logic assembly of claim 2, wherein:
    the first die includes the second selectable nonvolatile memory locations.

5. The programmable logic assembly of claim 4, wherein:
    the second selectable nonvolatile memory locations comprise a mask programmable read only memory.

6. The programmable logic assembly of claim 2, wherein:
    the second selectable nonvolatile memory locations are formed on the second die.

7. The programmable logic assembly of claim 6, wherein:
    the first selectable nonvolatile memory locations include a first address space of a nonvolatile memory device and the second selectable nonvolatile memory locations include a second address space of the nonvolatile memory device.

8. The programmable logic assembly of claim 1, further including:
    a select circuit that selects between the first and second selectable memory locations according to a predetermined event.

9. The programmable logic assembly of claim 8, wherein:
    the select circuit includes a multiplexer having a first input coupled to the first selectable nonvolatile memory locations, a second input coupled to the second selectable nonvolatile memory locations, and an output coupled to the programmable logic circuit.

10. The programmable logic assembly of claim 1, wherein:
    the first and second selectable nonvolatile memory locations are selectable in response to an event, the event being selected from the group consisting of application of power to the programmable logic assembly and a reset condition.

11. A method, comprising the steps of:
    configuring a programmable logic device (PLD) in an assembly with one configuration data set selected from a plurality of configuration data sets stored in nonvolatile memory locations in the assembly according to at least one address value stored in the PLD.

12. The method of claim 11, wherein:
    configuring the PLD includes enabling a data path between the volatile PLD and the nonvolatile memory locations storing the one configuration data set.

13. The method of claim 11, further including:
    configuring the PLD includes reading configuration data from one of a plurality of address spaces in a nonvolatile memory device, each address space storing a different configuration data set.

14. The method of claim 11, wherein:
    the configuration data set is selected by a method from the group consisting of detecting a predetermined overvoltage, receiving a predetermined command, and detecting the state of a nonvolatile circuit element.

15. The method of claim 11, wherein:
    the PLD comprises volatile circuit elements that are configured according to the one configuration data set.

16. A programmable logic assembly, comprising:
    a programmable logic device (PLD) that generates addresses for at least one of a plurality of configuration data sets from one of a plurality of nonvolatile memory locations in response to at least one event and according to a select state.

17. The programmable logic assembly of claim 16, wherein:
    at least one configuration data set configures the PLD into a microcontroller.

18. The programmable logic assembly of claim 16, wherein:
    the programmable logic assembly comprises at least one nonvolatile memory that includes at least one of the nonvolatile memory locations.

19. The programmable logic assembly of claim 18, wherein:
    the at least one nonvolatile memory is formed in a semiconductor substrate with the PLD.

20. The programmable logic assembly of claim 19, wherein:
    the assembly comprises a plurality of nonvolatile memories that each include at least one of the nonvolatile memory locations.

21. The programmable logic assembly of claim 16, wherein:
    the assembly comprises a multi-chip module.

* * * * *